(12) United States Patent
Jakobsen et al.

(10) Patent No.: US 9,046,566 B2
(45) Date of Patent: Jun. 2, 2015

(54) MEASURING SYSTEM FOR A DOWN CONDUCTOR OF A WIND TURBINE BLADE

(75) Inventors: Jeppe Jakobsen, Brande (DK); Kaj Olsen, Riiskov (DK)

(73) Assignee: SIEMENS AKTIENGESELLSCHAFT, München (DE)

( * ) Notice: Subject to any disclaimer, the term of this patent is extended or adjusted under 35 U.S.C. 154(b) by 656 days.

(21) Appl. No.: 13/210,443

(22) Filed: Aug. 16, 2011

(65) Prior Publication Data

US 2012/0043979 A1 Feb. 23, 2012

(30) Foreign Application Priority Data

Aug. 20, 2010 (EP) ..................................... 10173580

(51) Int. Cl.
G01R 27/20 (2006.01)
G01R 31/28 (2006.01)
G01R 31/02 (2006.01)

(52) U.S. Cl.
CPC ............ *G01R 31/2827* (2013.01); *G01R 27/20* (2013.01); *G01R 31/026* (2013.01); *Y02E 10/722* (2013.01); *Y02E 10/721* (2013.01)

(58) Field of Classification Search
USPC .......................... 324/691, 525, 76.11; 416/61
See application file for complete search history.

(56) References Cited

U.S. PATENT DOCUMENTS

| | | | |
|---|---|---|---|
| 6,717,420 B2* | 4/2004 | Eyraud et al. | 324/701 |
| 2006/0126252 A1 | 6/2006 | Mortensen | |
| 2012/0321468 A1* | 12/2012 | Hansen | 416/146 R |

FOREIGN PATENT DOCUMENTS

| | | |
|---|---|---|
| DE | 102008042287 A1 | 3/2010 |
| JP | 153503 | 6/1995 |
| JP | 2006109647 A | 4/2006 |
| JP | 2007278852 A | 10/2007 |
| JP | 2008101587 A | 5/2008 |
| JP | 2009250040 A | 10/2009 |

* cited by examiner

*Primary Examiner* — Vincent Q Nguyen

(57) ABSTRACT

A measuring system for a down conductor of a wind turbine blade includes a measuring cable connected in series with its first end to the down conductor. A second end of the measuring cable is accessible for measurement of the electrical resistance in a lower base part of the blade.

15 Claims, 4 Drawing Sheets

MEASURING SYSTEM FOR A DOWN CONDUCTOR OF A WIND TURBINE BLADE

CROSS REFERENCE TO RELATED APPLICATIONS

This application claims priority of European Patent Office application No. 10173580.1 EP filed Aug. 20, 2010, which is incorporated by reference herein in its entirety.

FIELD OF INVENTION

The invention is directed to a measuring system for a down-conductor of a wind turbine blade and to a blade and a wind turbine with a measuring system for a down conductor. More specifically the invention is directed towards measurement of the electrical resistance of the down conductor.

BACKGROUND OF INVENTION

Wind turbines are usually equipped with lightning protection systems to ensure that the large currents induced by a strike of lightning can be conducted to ground without damaging the components of the wind turbine.

The parts exposed the most to lightning are the blades. Therefore, blades are equipped with one or more internal down conductors. Each down conductor is connected to one or more lightning strike receptors which are arranged at the outer surface of the blade.

To ensure proper function of the down conductor it is necessary to know its electrical resistance. According to international standards registration of the electrical resistance of each installed down conductor is mandatory.

The electrical resistance of a down conductor of a blade is usually measured from an outside tip receptor to the bottom part of the blade. The measurement is done with an ohm meter or with a known current and a detection unit. Sometimes the measurement results are shown with a red or green light or an alarm sound or bell. To access the tip receptor can be difficult especially for already installed blades.

SUMMARY OF INVENTION

It is an object of the invention to improve the measurement of the electrical resistance of a down conductor of a wind turbine blade.

This object is solved according to the invention with the features of the claims. Advantageous modifications and/or details of the invention are disclosed in the dependent claims.

In one aspect the invention is directed to a measuring system for a down conductor of a wind turbine blade with a measuring cable connected in series with its first end to the down conductor. A second end of the measuring cable is accessible for measurement of the electrical resistance in a lower base part of the blade. This arrangement allows for easy measurement as both measurement contacts are located in the base of the blade. The term cable encompasses other suitable conductors as well.

The first end of the measuring cable may be connected to the down conductor in an upper part of the blade. If the first end is connected to the down conductor at the top or tip of the blade the whole down conductor can be measured. If the first end is connected to the down conductor for example in the middle of the blade half of the down conductor can be measured.

The down conductor and the measuring cable may be connected via a lightning receptor. The electrical resistance of the way the lightning current is actually travelling can be measured. The lightning receptor allows also easy installation of the measurement cable as there is already a fixture point present for the down conductor.

The lightning receptor may comprise electrical conducting materials of the group of aluminium, brass, stainless steel, and/or related alloys and/or carbon. The material or combination of materials can be chosen depending on price, weight or the situation of the blade or the wind turbine.

The down conductor and the measuring cable may be connected via a receptor block of the lightning receptor which accommodates changeable receptors. The invention can also be utilized with this receptor type which is widely used as replacement efforts after a strike of lightning are low.

The measuring system for a down conductor may comprise more than one measuring cable each connected to one of a plurality of lightning receptors which are connected to the down conductor. This allows for exact measurement of each possible way of the lightning current from the lightning receptors.

Two or more measuring cables may be provided for a compensated bridge measurement. Having more than one measurement cable allows for various bridge measurement combinations. Bridge measurements can be more precise and/or can compensate temperature drifts or supply line resistance.

The single measuring cables may be part of one or more multi-core or flat ribbon cables. These cables can be easier handled during installation.

The second end of the measuring cable or cables and/or the down conductor or down conductors may be connected to a termination block arranged at the base part of the blade, wherein the second end of the measuring cable or cables are detachably connected to the termination block. While being connected to the termination block the measuring cables are in a defined electrical state and accidental shorts can be prevented. The measuring cables and the down conductor can share one termination block or more than one termination block can be used. For example one termination block for the measuring cables and one termination block for the down conductor or down conductors.

In a second aspect the invention is directed towards a blade of a wind turbine comprising a down conductor and a measuring system for the down conductor as described above. If a single or more blades are fabricated and/or installed e.g. as a replacement it is advantageous to have the measuring system or systems installed.

In a further aspect the invention is directed towards a wind turbine comprising one or more blades as described above. For a complete wind turbine it is beneficial to have the measuring system or systems installed to the blade or blades.

In a further aspect the invention is directed towards a method for measuring the electrical resistance of a down conductor of a blade as described above, with the steps of:
   connecting an electrical resistance measurement device to the second end of the measuring cable;
   measuring the electrical resistance of the down conductor.

The method allows easy measurement of the electrical resistance of the down conductor as the electrical resistance measurement device like an ohm meter needs to be connected and can used simply at the base part of the blade.

A combined electrical resistance of the down conductor and the measuring cable may be measured and the electrical resistance of the down conductor may be calculated from the measured combined electrical resistance. If only the combined electrical resistance can or should be measured the electrical resistance of the down conductor can be calculated from it, for example with the known electrical resistance of the measuring cable.

Two of the measuring cables may be utilized for a compensated bridge measurement. Having more than one measurement cable allows for various bridge measurement combinations. Bridge measurements can be more precise and/or can compensate temperature drifts or supply line resistance.

BRIEF DESCRIPTION OF THE DRAWINGS

The accompanying drawings are included to provide a further understanding of embodiments. Other embodiments and many of the intended advantages will be readily appreciated as they become better understood by reference to the following detailed description. The elements of the drawings do not necessarily scale to each other. Like reference numbers designate corresponding similar parts.

DETAILED DESCRIPTION OF INVENTION

In the following detailed description, reference is made to the accompanying drawings which form a part hereof and in which are shown by way of illustration specific embodiments in which the invention may be practised. In this regard, directional terminology, such as "top" or "bottom" etc. is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
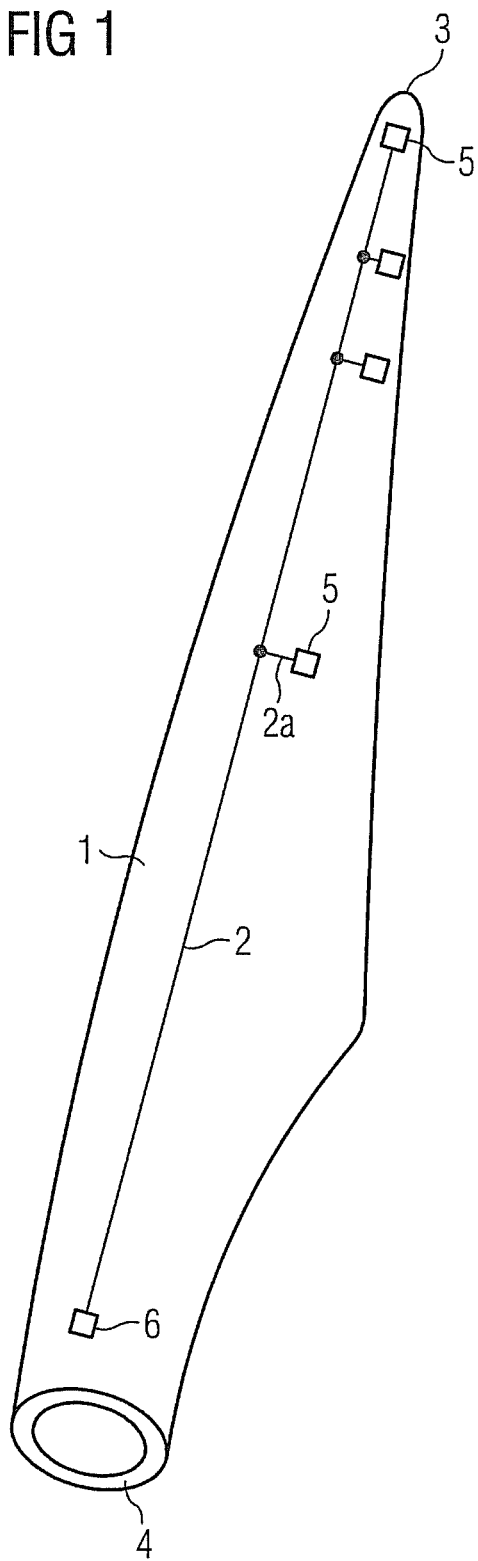
FIG. 1 illustrates a schematic view of a known blade of a wind turbine.

FIG. 1 shows a conventional blade 1 for a wind turbine. A wind turbine usually has one to three blades 1 which are attached to a rotating blade hub. The blade hub rotates around a main shaft which is mounted on top of a tower. Usually a nacelle surrounds the main shaft and electrical systems like the generator.

The blade 1 has an internal down conductor 2 which reaches from an upper tip or top 3 of the blade 1 to a lower base part 4. The down conductor 2 is a conductor usually made of metal in form of a cable or a bar. The diameter of the down conductor 2 amounts to fifty square millimeters or more in most applications.

Several receptor blocks 5 are connected to the down conductor 2. The receptor blocks 5 are distributed over the length of the down conductor 2 wherein the number of receptor blocks 5 depends on the length of the blade 1. The receptor block 5 can be directly attached to the down conductor 2 or via a short stub 2a which is also part of the down conductor 2.

The receptor block 5 consists of a conducting material like for example aluminium. The receptor block 5 has two openings to which lightning receptors are connected. One receptor is provided for each of the two sides of the blade 1. The combination of receptor block 5 and receptors is often denominated lightning receptor as well.

The lower end of the down conductor 2 is connected to a termination block 6 which is the connection point between the down conductor 2 of the blade 1 and the subsequent further parts of the lightning protection system of the wind turbine.

Figure 2:
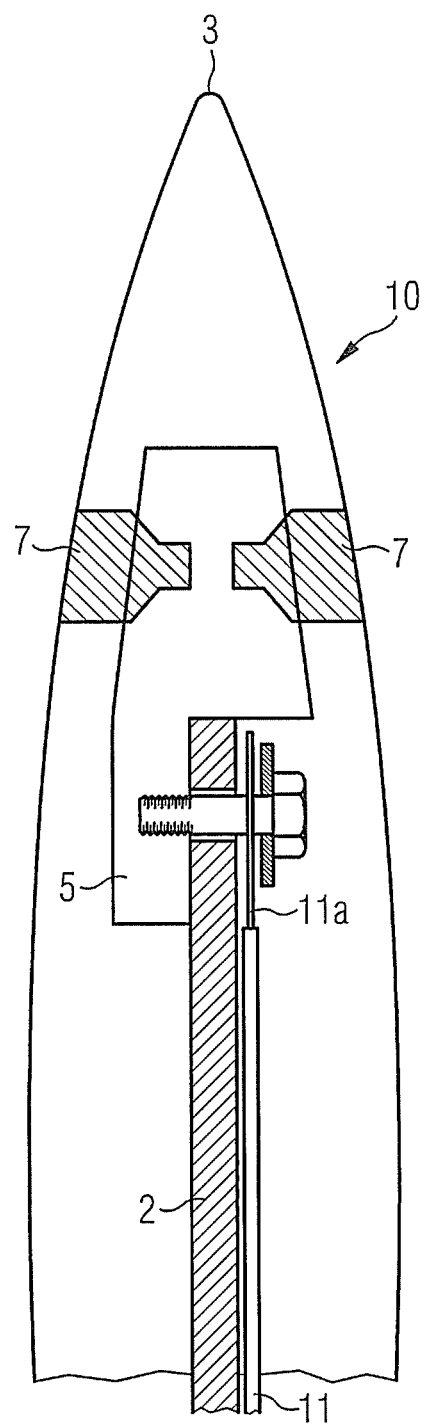
FIG. 2 illustrates a schematic view of a tip of a blade with a measuring system for a down conductor according to the invention.

FIG. 2 shows the upper part 3 of the blade 1 in greater detail. Two receptors 7 are arranged at the receptor block 5. As can be seen one receptor 7 is provided for each side of the blade 1. The down conductor 2 is connected to the receptor block 5 with a bolt 8 and a washer 9. Other connections either detachable or fixed can be used as well.

The blade 1 is equipped with a measuring system 10 for the down conductor 2. The measuring system 10 comprises a measuring cable 11 having a first end 11a connected to the down conductor 2. The first end 11a may alternatively be connected to the conducting receptor block 5 which in turn is in connection with the down conductor 2. Hence, the first end 11a of the measuring cable 11 is either directly or indirectly connected with the down conductor 2.

The measuring cable 11 is preferably an insulated cable.

Figure 3:
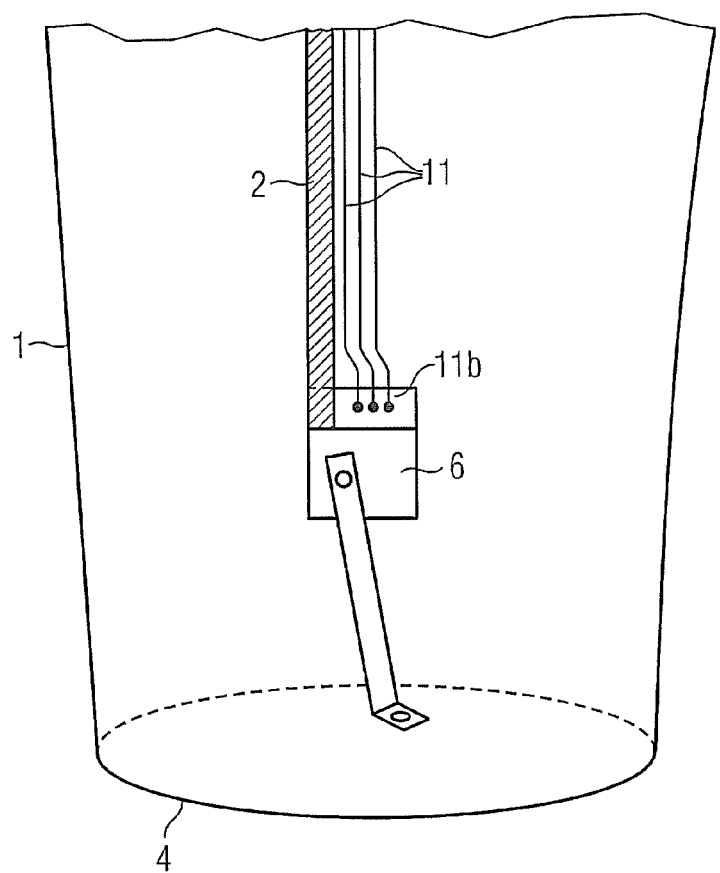
FIG. 3 illustrates a schematic view of a base part of a blade with a measuring system for a down conductor according to the invention.

FIG. 3 shows the base part 3 of the blade 1. Connected to the termination block 6 are the down conductor 2 and the second ends 11b of the measuring cables 11. The second ends 11b are detachably connected to the termination block 6 to allow release of the measuring cable 11 for the measurement process.

The number of measuring cables 11 depends on the number of receptor blocks 5. One or two measuring cables 11 are provided for each receptor block 5—depending on the method of measurement. For a simple resistance measurement one cable is sufficient while for a compensated bridge measurement two cables can be provided.

Figure 4:
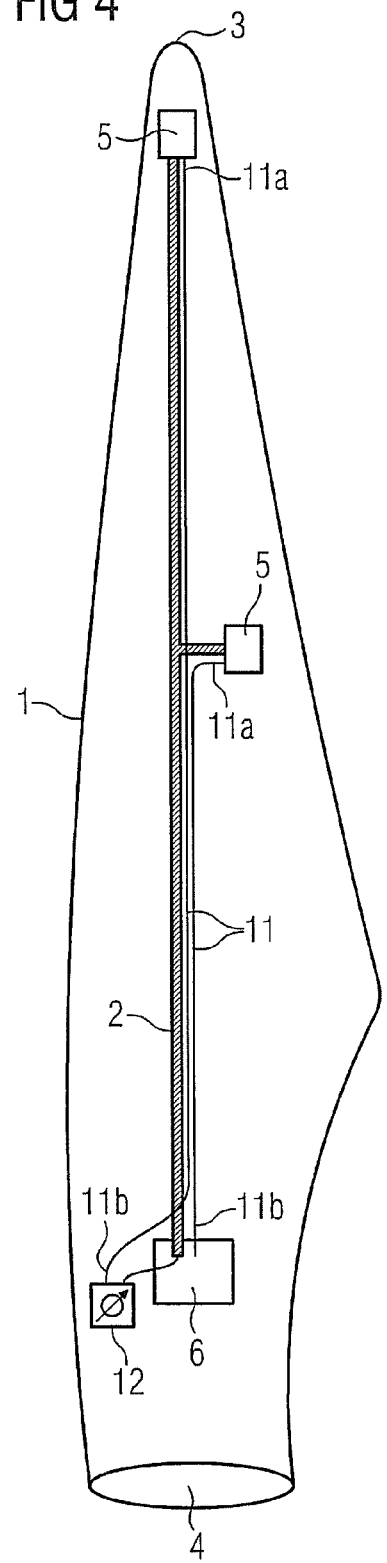
FIG. 4 illustrates a schematic view of a blade with a measuring system for a down conductor according to the invention.

FIG. 4 shows the complete blade 1 with the measuring system 10. For the sake of easy understanding only two receptor blocks 5 are depicted. Each receptor block 5 is connected to the down conductor 2 which terminates in the termination block 6. Each receptor block 5 is further connected with a first end 11a of a measuring cable 11. The second ends 11b of the measuring cables 11b are detachably connected to the termination block 6.

The second end 11b of the measuring cable 11 which is connected with the topmost receptor block 5 is disconnected from the termination block for measurement of the electrical resistance of the down conductor 2. An electrical resistance measurement device 12 like an ohm meter is connected to the second end 11b of the measuring cable 11 and to the lower end of the down conductor 2 or the termination block 6 for measurement.

As the down conductor 2 and the measuring cable 11 are connected in series easy measurement of the electrical resistance of the down conductor 2 is possible. Interaction is required only at the base part 4 of the blade 1.

The electrical resistance of the electrical path from the receptor block 5 in the middle of the blade 1 can be measured as well when the other measuring cable is disconnected from the termination block 6 and connected with the ohm meter 12. In this case part of the down conductor 12 is measured.

To clarify the term down conductor the following statements are made. The term down conductor is used above for the complete length of the conductor from the topmost receptor block 5 to the termination block 6. The term part of the down conductor is used for the partial length of the conductor from the middle receptor block 5 (or any other receptor block)

to the termination block 6. However, the partial length of the down conductor 2 can be designated as "the down conductor" as well. From the viewpoint of the middle receptor block 5 or the current induced there this part of the down conductor is the complete down conductor.

Different kinds of measurement methods can be employed. One method is shown in FIG. 4 where the electrical resistance of the series connection of the down conductor 2 is measured directly. It might be necessary to correct the measurement result with the (known) electrical resistance value of the measuring cable 11.

With two or more cables a compensated bridge measurement is also possible. Then, either two measuring cables 11 are connected to each receptor block 5 or two or more measuring cables 11 from different receptor blocks 5 are used.

The invention claimed is:

1. A lightning down conductor measuring system of a wind turbine blade, comprising:
   a measuring cable comprising:
      a first end and a second end, the first end of the measuring cable is connected to the lightning down conductor and the second end is detachably connected to a lower base part of the wind turbine blade to allow release of the measuring cable for a measurement of the electrical resistance of the lightning down conductor.

2. The lightning down conductor measuring system according to claim 1, wherein the first end of the measuring cable is connected to the lightning down conductor in an upper part of the wind turbine blade.

3. The lightning down conductor measuring system according to claim 2, wherein the lightning down conductor and the measuring cable are connected via a lightning receptor.

4. The lightning down conductor measuring system according to claim 1, wherein the lightning down conductor and the measuring cable are connected via a lightning receptor.

5. The lightning down conductor measuring system according to claim 4, wherein the lightning receptor comprises an electrical conducting material selected from the group of aluminium, brass, stainless steel, related alloys and carbon.

6. The lightning down conductor measuring system according to claim 4, wherein the lightning down conductor and the measuring cable are connected via a receptor block of the lightning receptor which accommodates changeable receptors.

7. The lightning down conductor measuring system according to claim 4, comprising a plurality of measuring cables each connected to one of a plurality of lightning receptors which are connected to the lightning down conductor.

8. The lightning down conductor measuring system according to claim 7, comprising two of the measuring cables in order to provide a compensated bridge measurement.

9. The lightning down conductor measuring system according to claim 7, wherein the single measuring cables are part of one or more multi-core cables.

10. The lightning down conductor measuring system according to claim 1, wherein the second end of the measuring cable or cables and/or the lightning down conductor or lightning down conductors are connected to a termination block arranged at the base part of the wind turbine blade, wherein the second end of the measuring cable or cables are detachably connected to the termination block.

11. A wind turbine blade comprising
   a lightning down conductor, and
   a lightning down conductor measuring system according to claim 1.

12. A method for measuring the electrical resistance of a lightning down conductor of a wind turbine blade according to claim 11, of the method comprising:
   connecting an electrical resistance measurement device to the second end of the measuring cable; and
   measuring the electrical resistance of the lightning down conductor.

13. The method for measuring according to claim 12, further comprising:
   measuring a combined electrical resistance of the lightning down conductor; and
   measuring cable; and calculating the electrical resistance of the lightning down conductor from the measured combined electrical resistance.

14. The method for measuring according to claim 13, wherein the wind turbne blade comprises two of the measuring cables, further comprising providing a compensated bridge measurement.

15. The method for measuring according to claim 12, wherein the wind turbine blade comprises two of the measuring cables, further comprising providing a compensated bridge measurement.

* * * * *